(12) United States Patent
Dingle et al.

(10) Patent No.: US 12,533,994 B2
(45) Date of Patent: Jan. 27, 2026

(54) THERMAL MANAGEMENT MODULE

(71) Applicant: EV THERMAL FLOW SOLUTIONS LLC, Southfield, MI (US)

(72) Inventors: Philip John Gregory Dingle, Rochester, MI (US); Mark Raymond Rimkus, Chicago, IL (US)

(73) Assignee: EV Thermal Flow Solutions LLC, Southfield, MI (US)

( * ) Notice: Subject to any disclaimer, the term of this patent is extended or adjusted under 35 U.S.C. 154(b) by 134 days.

(21) Appl. No.: 18/500,640

(22) Filed: Nov. 2, 2023

(65) Prior Publication Data

US 2024/0140271 A1 May 2, 2024

Related U.S. Application Data

(60) Provisional application No. 63/421,845, filed on Nov. 2, 2022.

(51) Int. Cl.
*B60L 58/26* (2019.01)
*H05K 7/20* (2006.01)

(52) U.S. Cl.
CPC .............. *B60L 58/26* (2019.02); *H05K 7/209* (2013.01); *H05K 7/20945* (2013.01)

(58) Field of Classification Search
CPC .... B60L 58/26; H05K 7/209; H05K 7/20945; B60H 1/00278
See application file for complete search history.

(56) References Cited

U.S. PATENT DOCUMENTS

| | | | |
|---|---|---|---|
| 2019/0020077 A1* | 1/2019 | Campbell | H01M 10/613 |
| 2019/0337355 A1 | 11/2019 | Shah et al. | |
| 2020/0001685 A1* | 1/2020 | Quix | B60H 1/143 |
| 2021/0053415 A1* | 2/2021 | Oh | B60H 1/3229 |
| 2022/0055502 A1 | 2/2022 | Mohlin et al. | |
| 2022/0118816 A1 | 4/2022 | Graubmann | |
| 2023/0018407 A1* | 1/2023 | Eslava Orradre | F04D 13/14 |
| 2023/0226877 A1* | 7/2023 | Hu | H01M 10/6568 62/79 |
| 2023/0338766 A1* | 10/2023 | Chaltry | A62C 35/58 |

FOREIGN PATENT DOCUMENTS

| | | | |
|---|---|---|---|
| CN | 114750646 A | 7/2022 | |
| DE | 102015016786 A1 * | 6/2017 | B60K 1/00 |
| DE | 102020133517 A1 | 6/2021 | |

OTHER PUBLICATIONS

DE-102015016786-A1 translation.*
Written Opinion of the International Searching Authority dated Apr. 9, 2024.

* cited by examiner

Primary Examiner — Elizabeth J Martin
(74) Attorney, Agent, or Firm — Ward Law Office LLC; Jacob Ward

(57) ABSTRACT

A thermal management module includes a first compartment including one or more of a coolant pump, a coolant valve, and a coolant conduit. A conjoined second compartment includes one or more of a valve actuator, an electronic control module, a system pressure sensor, a temperature sensor, and a heat exchanger. In certain embodiments, the first compartment is enclosed in a first modular enclosure and the conjoined second compartment is separately enclosed within a second modular enclosure.

20 Claims, 12 Drawing Sheets

THERMAL MANAGEMENT MODULE

CROSS-REFERENCE TO RELATED APPLICATIONS

This application claims the benefit of U.S. Provisional Application No. 63/421,845, filed on Nov. 2, 2022. The entire disclosure of the above application is incorporated herein by reference.

FIELD

The present technology relates to the field of thermal management. More specifically, the present invention relates to the thermal management of electrically propelled vehicles and in which the principal components comprising the thermal management system are aggregated into a single module.

INTRODUCTION

This section provides background information related to the present disclosure which is not necessarily prior art.

The global economy is presently going through a sea of change wherein dominance of propulsion by the internal combustion engine (ICE) is being challenged by electric propulsion for multiple reasons but principally because of its greater energy efficiency and potentially lower global warming footprint. This change is affecting all forms of propulsion on land, sea, and air. Electrical propulsion involves several components or subsystems including an energy storage device which may include a capacitor, a super capacitor, an accumulator or battery, or a combination of these devices. Some applications develop electrical power at the point of use through a conversion process using a fuel cell that uses for example, hydrogen as the fuel in conjunction with a proton exchange membrane (PEM).

These systems also require devices for power management and this function may be provided by several modules including a charging circuit which may include an AC to DC rectifier, a voltage conversion circuit which may include a voltage inverter, and a DC-to-DC converter. To convert the stored energy into motive power, one or more electric motors are incorporated into the system.

For the usability of electric vehicles, it is important that the energy storage system has a long lifetime, i.e., a large number of charge/discharge cycles possible before the cells fail to operate satisfactorily. Keeping the energy storage system in an optimal temperature range is essential to maximize the lifetime.

Besides improving the energy storage system lifetime, keeping the energy storage system within the optimal temperature range during operation ensures that the energy storage system delivers as much power as possible.

As well as keeping the energy storage system at an optimal temperature, the temperature in the cabin, where the operator and passengers of the vehicle are housed, should also be regulated.

The science of thermal management of an electrically propelled vehicle, whether a car, a truck, an agricultural or industrial vehicle is complex. The higher thermal efficiency of the electrical components means that there is less waste heat to dissipate, and thus the thermal energy that is present must be carefully managed. Further, depending upon the chemistry involved, the energy storage device may have a narrow temperature range over which optimal performance and life may be obtained; a typical range might be 22 degrees Celsius plus/minus 4 degrees. Other components of the vehicle system may have a much wider temperature range over which optimum performance and life are obtained. Thus, the thermal management system may have two or more distinct temperature regimes under its control and for which it is responsible. In many cases there may be an operator's cabin that will require to be heated or cooled, and this too may become the responsibility of the thermal management system.

Since the energy to propel the vehicle and to heat or cool the electrical propulsion components as well as the operator's cabin must come from the energy storage device which has a finite capacity between charging events, it is necessary to make as efficient use of that energy as possible. Should there be excess heat available from one component or sub-system within the overall thermal management system, then means should be provided for efficient use of that energy by transferring it to another component or sub-system where beneficially possible and useful. This may involve the transfer of heat energy from, for example, the traction motor to, for example, the energy accumulator or the operator's cabin, or vice versa. It may also involve the transfer of excess heat energy from, for instance, the energy accumulator for dissipation by the HVAC subsystem. The thermal management heat transfer medium is typically a fluid and is often a mixture of water and ethylene glycol in an appropriate ratio.

From the foregoing, it will be apparent that the thermal management system of an electric vehicle involves many components that may include electrically driven pumps, valves with actuators, heat exchangers, fans, coolant heaters, coolant chillers, sensors, and an electronic controller. Interconnecting these components will be pipework and related plumbing to conduct the coolant with an optimum routing. It will be recognized that these thermal management components occupy valuable space on a vehicle, add weight, and their assembly into a system on the vehicle involves labor and expense. Continuously mixing the coolant that circulates through the energy accumulator module with the coolant that circulates through the higher temperature traction motor and power electronics also creates difficulties in tightly regulating the temperature of the energy accumulator, a function that is critical if, in the event of a malfunction, thermal runaway of the energy accumulator is to be avoided.

Aggregating the many components of the thermal management system such as pumps and valves and heat exchangers for an electrically propelled vehicle into a single module offers a convenient solution to the vehicle manufacturer with respect to the time, labor, and expense associated with fit-up during assembly of the vehicle. In this respect, the modular concept improves upon the current cooling module paradigm often used by internal combustion engine vehicle manufacturers. Such an arrangement may typically utilize conventional commodity items which may still need to be plumbed together using hoses that require significant room and are prone to leak at the connections. Therefore, what is needed is a modular thermal management module which may be easily mounted to a vehicle chassis and which speeds vehicle assembly by minimizing the number of plumbing connections.

SUMMARY

In concordance with the instant disclosure, a thermal management system which embodies a modular concept, and which may be easily mounted to a vehicle chassis has surprisingly been discovered.

Ways of making and using a thermal management system for an electrically propelled vehicle are provided. In certain embodiments, a thermal management module may include a first compartment including one or more of a coolant pump, a coolant valve, and a coolant conduit. A conjoined second compartment may include one or more of a valve actuator, an electronic control module, a system pressure sensor, a temperature sensor, and a heat exchanger. In certain embodiments, the first compartment may be enclosed in a first modular enclosure and the conjoined second compartment may be separately enclosed within a second modular enclosure that is integral with the first compartment. In certain embodiments, the conjoined second compartment may be joined or linked together with the first compartment within the thermal management module.

The first modular enclosure and the second modular enclosure may each include a hermetically sealed enclosure. The second modular enclosure may include a multi-pin connection configured to connect to a battery of a vehicle for providing electrical power and communication to the thermal management module. The multi-pin connection may enable communication between the vehicle and the thermal management module.

In certain embodiments, the thermal management module may further include a coolant circulation loop that extends between the thermal management module and one or more chassis mounted components. A first coolant circulation loop and a second coolant circulation loop of the thermal management module may be independent. In certain embodiments, the thermal management module may comprise more than two coolant circulation loops. A temperature of the first coolant circulation loop and a temperature of the second coolant circulation loop may be independently regulated. The first coolant circulation loop and the second coolant circulation loop may be interconnected thereby allowing equalization of pressure within the thermal management module. In certain embodiments, the thermal management module may include a fluid-to-fluid heat exchanger, where the fluid-to-fluid heat exchanger is configured to transfer heat energy between the first coolant circulation loop and the second coolant circulation loop. A heat accumulator may be configured to store excess heat generated by the thermal management module.

A method may be included for using the using the thermal management module. In certain embodiments, a vehicle may include the thermal management module. For example, the thermal management module may be attached to a chassis of the vehicle. However, as would be understood by someone of ordinary skill in the art, the thermal management module may be attached to any appropriate location on the vehicle.

In still certain embodiments, a method of preventing a thermal runaway event in an electrical vehicle battery of an electric vehicle may include detecting, using a sensor, a vehicle battery pack failure. Consequently, a coolant which may or may not be electrically conductive may be delivered to the battery pack after the sensor is triggered by an indicated battery pack failure. In certain embodiments, the triggering of the sensor may include detecting an off-gassing of the battery pack. The vehicle battery may include multiple vehicle battery packs or compartments and each battery pack or compartment may have an off-gassing sensor. In certain embodiments, the vehicle battery pack may include an orifice configured to deliver the coolant to the battery pack. The orifice may normally be occluded with a temperature reactive material which reacts at a predetermined temperature to enable delivery of the coolant to the battery pack. The temperature reactive material may include a wax which may be configured to melt in response to heat generated by the battery pack failure.

DRAWINGS

The drawings described herein are for illustrative purposes only of selected embodiments and not of all possible implementations, and are not intended to limit the scope of the present disclosure.

DETAILED DESCRIPTION

Figure 1:
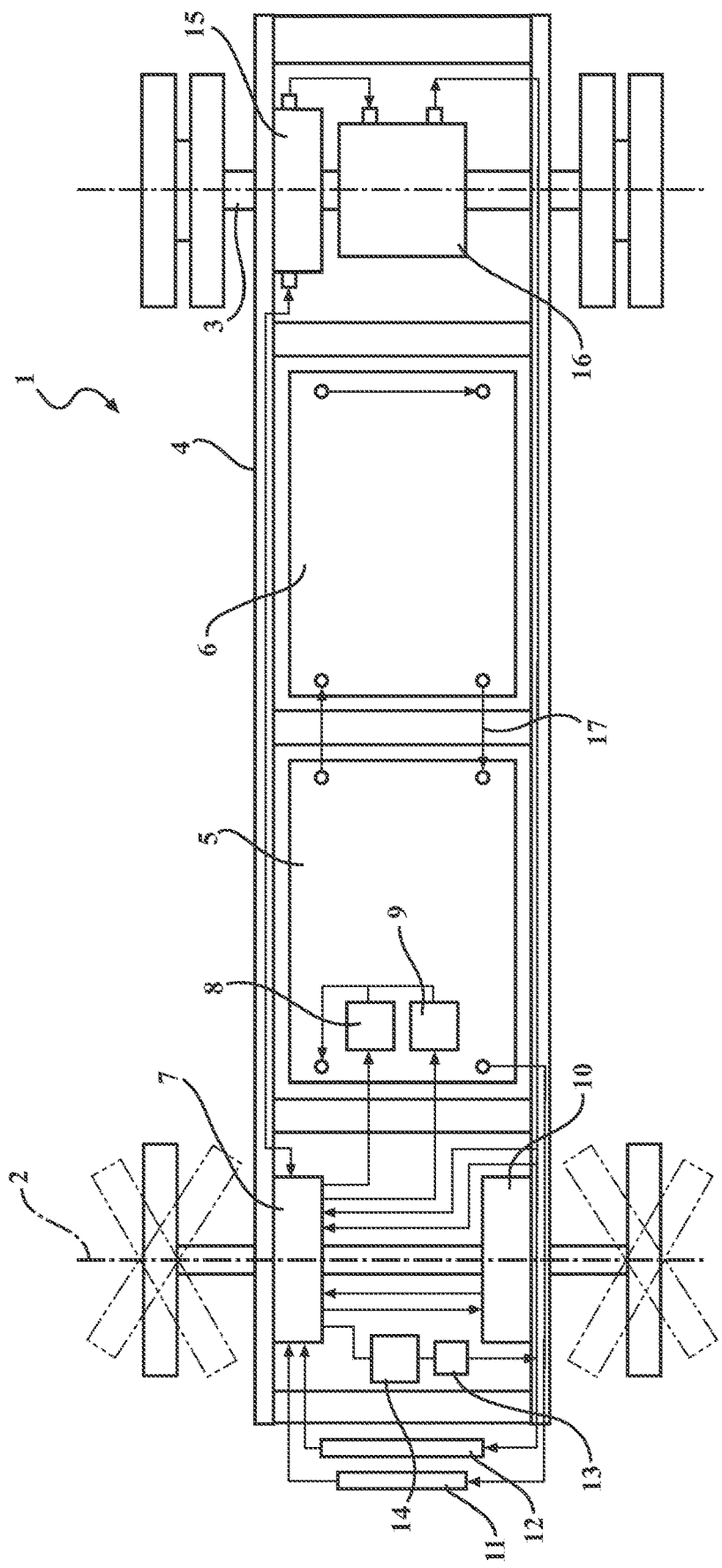
FIG. 1 is a schematic diagram depicting the component layout of a representative electrically propelled vehicle, according to an embodiment of the present disclosure.

The following description of technology is merely exemplary in nature of the subject matter, manufacture, and use of one or more inventions, and is not intended to limit the scope, application, or uses of any specific invention claimed in this application or in such other applications as may be filed claiming priority to this application, or patents issuing therefrom. Regarding methods disclosed, the order of the steps presented is exemplary in nature, and thus, the order of the steps may be different in various embodiments, including where certain steps can be simultaneously performed, unless expressly stated otherwise. "A" and "an" as used herein indicate "at least one" of the item is present; a plurality of such items may be present, when possible. Except where otherwise expressly indicated, all numerical quantities in this description are to be understood as modified by the word "about" and all geometric and spatial descriptors are to be understood as modified by the word "substantially" in describing the broadest scope of the technology. "About" when applied to numerical values indicates that the calculation or the measurement allows some slight imprecision in the value (with some approach to exactness in the value; approximately or reasonably close to the value; nearly). If, for some reason, the imprecision provided by "about" and/or "substantially" is not otherwise understood in the art with this ordinary meaning, then "about" and/or "substantially" as used herein indicates at least variations that may arise from ordinary methods of measuring or using such parameters.

All documents, including patents, patent applications, and scientific literature cited in this detailed description are incorporated herein by reference, unless otherwise expressly indicated. Where any conflict or ambiguity may exist between a document incorporated by reference and this detailed description, the present detailed description controls.

Although the open-ended term "comprising," as a synonym of non-restrictive terms such as including, containing, or having, is used herein to describe and claim embodiments of the present technology, embodiments may alternatively be described using more limiting terms such as "consisting of" or "consisting essentially of" Thus, for any given embodiment reciting materials, components, or process steps, the present technology also specifically includes embodiments consisting of, or consisting essentially of, such materials, components, or process steps excluding additional materials, components or processes (for consisting of) and excluding additional materials, components or processes affecting the significant properties of the embodiment (for consisting essentially of), even though such additional materials, components or processes are not explicitly recited in this application. For example, recitation of a composition or process reciting elements A, B and C specifically envisions embodiments consisting of, and consisting essentially of, A, B and C, excluding an element D that may be recited in the art, even though element D is not explicitly described as being excluded herein.

As referred to herein, all compositional percentages are by weight of the total composition, unless otherwise specified. Disclosures of ranges are, unless specified otherwise, inclusive of endpoints and include all distinct values and further divided ranges within the entire range. Thus, for example, a range of "from A to B" or "from about A to about B" is inclusive of A and of B. Disclosure of values and ranges of values for specific parameters (such as amounts, weight percentages, etc.) are not exclusive of other values and ranges of values useful herein. It is envisioned that two or more specific exemplified values for a given parameter may define endpoints for a range of values that may be claimed for the parameter. For example, if Parameter X is exemplified herein to have value A and also exemplified to have value Z, it is envisioned that Parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if Parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, 3-9, and so on.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer, or section. Terms such as "first," "second," and other numerical terms when used herein do not imply a sequence or order unless clearly indicated by the context. Thus, a first element, component, region, layer, or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below," or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" or "another embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

The present technology is designed to arrange the necessary components of the thermal management system for an electrically propelled vehicle in a particularly compact and efficient manner such that it may be formed as a single module that is easy and convenient to install into a vehicle. The sub-component pumps, valve actuators and sensors may be controlled by an electronic controller that is integral to the module.

The present technology provides a thermal management module that incorporates a plurality of coolant loops that are substantially thermally independent of each other, including a "low temperature" loop which may service the energy accumulator thermal requirements, and a second "high temperature" loop which may service the thermal requirements of the power electronics, the traction motors, and the interior operator's cabin. Other loops may be included as required, for example a still higher temperature loop to provide thermal management of fuel cell components where relevant and as appropriately desired.

The present technology also provides a countermeasure to be utilized in the event that an appropriate sensor indicates that a potential thermal runaway event is imminent within the energy accumulator sub-system. Specifically, the countermeasure may include the ability to flood the affected cells of the battery with coolant drawn from an internal reservoir that may be included in the module. In particular, certain battery types and chemistries may be susceptible to a self-destructive condition known as thermal runaway during which an internal malfunction such as a short-circuit at the individual battery cell level may cause a release of energy that intensifies to the point that a battery cell may self-destruct and forcibly eject material that is at an elevated temperature. The heat generated may then overpower the battery cooling system and spread to adjacent cells which then may break down in a similar manner. The heat created by the compound effect of multiple cells failing in this manner may cause a conflagration that immolates the associated vehicle and adjacent properties. However, in certain embodiments, early detection of a battery cell failure may be identified by appropriate sensors built into the battery. Such sensors may include those that detect an early amount of off-gassing from the battery pack. Further, by using this off-gassing detection to initiate an effective countermeasure the system can short-circuit the cell or cells that are in distress, thereby preventing an internal cell breakdown, and subsequently avoiding and suppressing a conflagration from the violent ejection of high temperature material.

In addition, the present technology may provide a device that provides thermal control of the temperature of one or more subsystems that are integral to an electrically propelled vehicle, such as a thermal management device. The thermal management device may be referred to herein as a module because it may be combined as a single unit. In certain embodiments, the thermal management module may be encompassed by an enclosure, where all of the components of the thermal management unit may be arranged in the enclosure, and where the input ports and output ports are openings in the enclosure. The enclosure may create an easy to handle and easy to install unit, such as a plug and play solution.

In certain embodiments, the thermal management module may be formed of two parts within the enclosure. These two parts or sections may include a "wet" part, which incorporates pumps, valves, and interconnecting conduits for the coolant, and a "dry" part that may house serviceable components, such as the valve actuators, an electronic control module, a wiring harness, system pressure sensors, temperature sensors, and a heat exchanger. The thermal management module may be further connected to, engaged with or otherwise in communication with a component of the electric vehicle that requires cooling with a thermal fluid. For example, the module may function in connection with one or more parts of the power train, an e-motor, inverter, DC/DC converter, AC/DC converter, or AC/DC/AC converter.

The energy storage system referenced herein may be defined as any kind of battery pack or series of batteries for powering an electric motor of an electric vehicle and an electric vehicle. In other words, when the term energy storage system is used in this disclosure, any kind of energy storage system for electric vehicles may be included, for example a plurality of batteries. For example, an energy storage system for an electric vehicle may comprise a plurality of batteries in series, and those batteries may include battery packs of single battery cells. A combination of batteries and capacitors is also contemplated, as appropriately desired.

In the figures, the lines connecting the various components represents piping for thermal fluid. The arrows illustrated in connection to the piping in the figures are to show the intended flow direction of thermal fluids in the pipes. The piping may comprise any piping suitable to hold thermal fluid as appropriately desired. Depending on the thermal fluid, the piping may comprise, for example, plastic piping, metal piping or rubber piping. However, the piping may include any appropriately desired piping for carrying and holding the thermal fluid.

The module may also include a heater for heating thermal fluid. The heater may include, for example, a high voltage heater, a low-voltage resistor heater or PTC-type heater or an AC-powered heater. The heater may also be a condensing part of a heat-pump system. The heater may include any appropriately desired heater for heating thermal fluids suitable to be arranged in an electric vehicle.

The module may further include a cooling unit or chiller. The cooling unit may include a compressor which, with a thermal expansion valve arranged in association with an evaporator or a heat exchanger may form a refrigeration machine. In such a case, thermal vapor may be used for cooling. The cooling unit may also include a heat-pump system.

In certain embodiments, the module may include a heat exchanger. The heat exchanger may be arranged to transfer thermal energy from a thermal fluid to another thermal fluid, or from one fluid to several fluids. The heat exchanger may be, for example, a coolant-to-coolant heat exchanger that may transfer heat energy from one loop to another.

In particular, the present technology may integrate the essential components of the thermal management module such as the necessary pumps, valves, and heat exchanger into a single module or box for rigidity, integrity and compactness. This module may then be securely and easily mounted to a chassis of a vehicle. Additionally, the present technology has the capability to flood a damaged battery component with a coolant fluid, examples of such fluids include, but are not limited to, a 50/50 water glycol mixture, and/or an oil mixture for fire suppression, or other similar fluids known to those of skill in the art.

Additionally, a heat accumulator may be integrated into the system to capture otherwise wasted heat such that the heat may be available for later use when it is needed. Moreover, the coolant loop for interior heat may be bi-directional; in one flow direction where the electrical heat may be used to heat an interior coolant, and in the other direction the waste heat from the powertrain side may be used for this purpose.

Example embodiments of the present technology are provided with reference to the several figures enclosed herewith.

FIGS. 1-8 depict embodiments of the present technology which may be used in an electrically propelled vehicle. The electrically propelled vehicle may include a commercial vehicle shown without a mounted body, for example.

As shown in FIG. 1, a vehicle includes a chassis frame comprising side frame rails spaced apart by crossmembers and the whole being supported on front and rear axles. The disposition within the chassis frame of the various components of the electric propulsion system are illustrated. Pipework for conducting the cooling fluid between the components may be shown as lines having arrows indicating the intended direction of flow. The illustrated vehicle has a front steer axle and a rear drive axle spaced apart from each other. In certain embodiments, the coolant liquid may flow in a single direction. Alternatively, or in conjunction, the coolant liquid may flow in multiple or opposite directions as appropriately desired.

In FIG. 1, an electrically propelled vehicle 1 is shown, having a front axle 2 and a rear axle 3 that may support the chassis frame 4 comprising side members spaced apart by cross members. The chassis frame 4 may support principal components of the electric propulsion system including energy storage accumulators 5, 6, a thermal management module 7, a thermal fluid chiller 8 and a thermal fluid heater 9 that may control the temperature of the energy accumulator. Other components of the electrically propelled vehicle 1 may include an on-board charger module 10 that may incorporate additional functionality such as DC-to-DC charging switchgear.

In certain embodiments, substantially independent thermal cooling hydraulic circuits may be provided for use in the system for the low temperature circuit radiator 11 and the high temperature circuit radiator 12. Thermal control of the vehicle interior cabin may be undertaken by a heating/cooling HVAC module supplemented by a heater 14. AC/DC/AC power conversion may be managed by an inverter 15 with a traction motor for providing motive power. Interconnecting these identified system components may be hoses and pipework for transferring the thermal cooling fluid. One example of these conduits is shown at hydraulic connection 17 with an arrow indicating an intended coolant flow direction. Other systems may be used without departing from the spirit of the present technology, as appropriately desired.

Figure 2A:
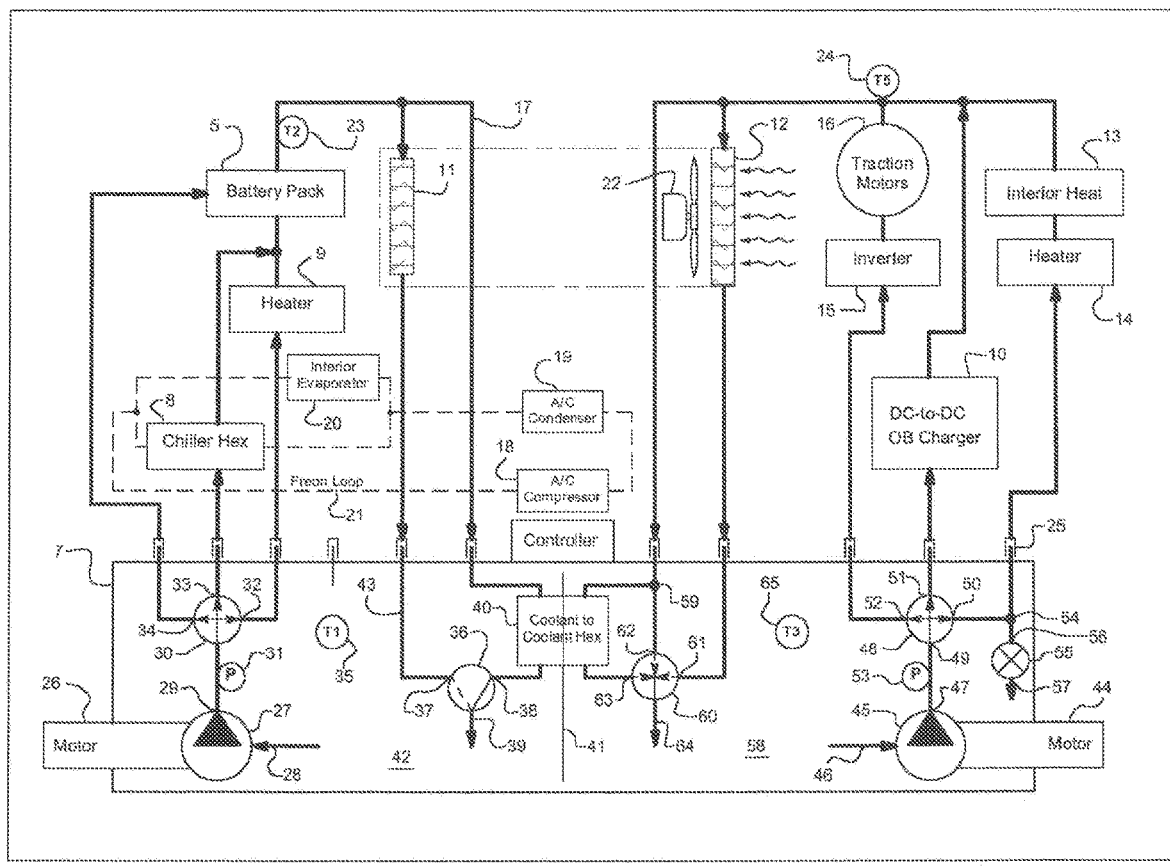
FIGS. 2A-2C are schematic diagrams depicting the thermal management coolant flow circuit of a representative electrically propelled vehicle, according to an embodiment of the present disclosure.
Figure 2B:
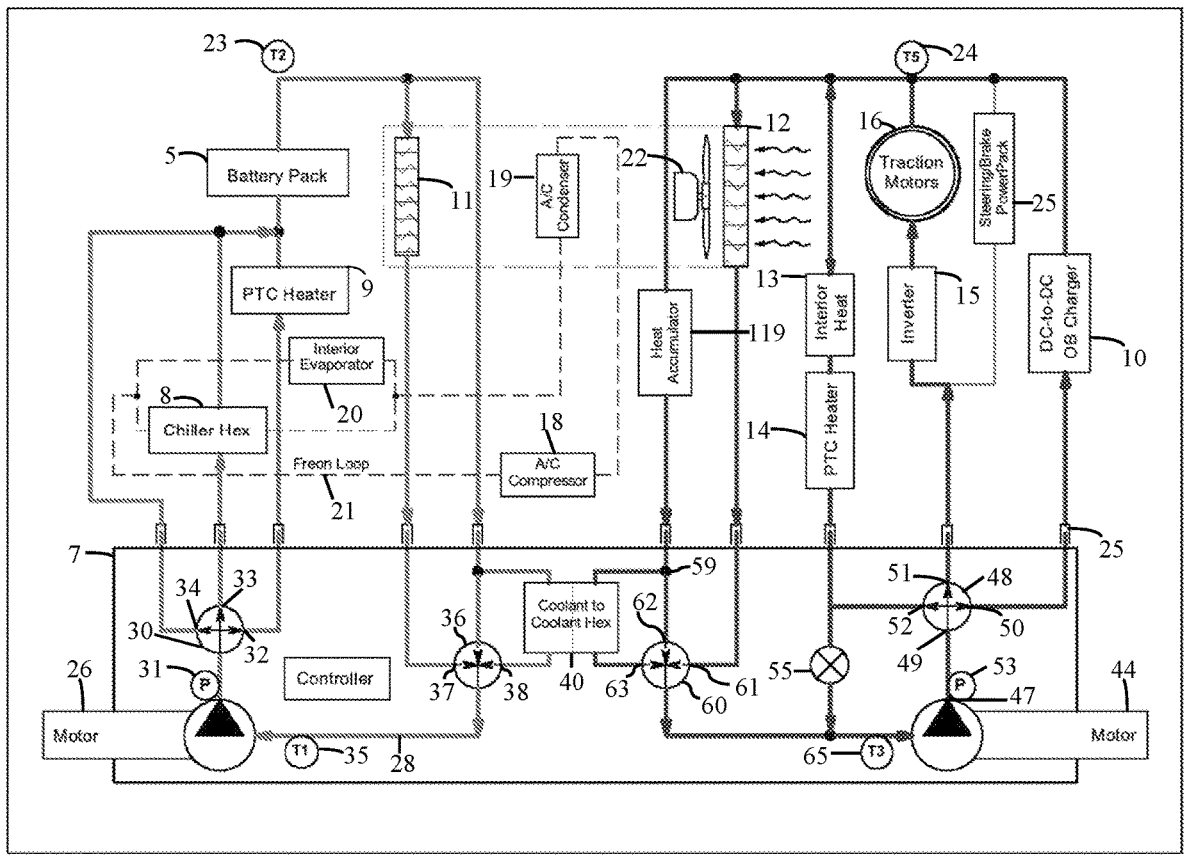
Figure 2C:
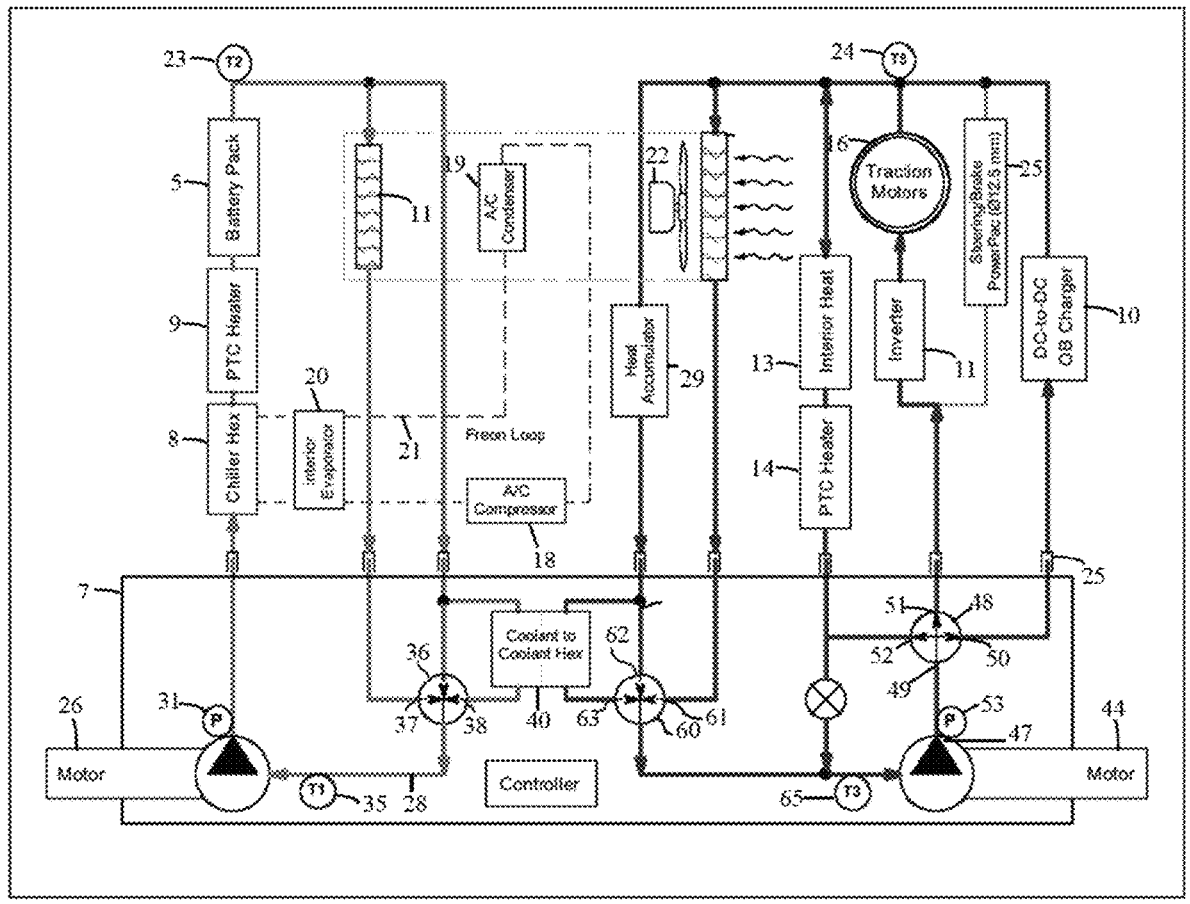

FIGS. 2A-2C show exemplary hydraulic circuit schematics for a low and a high temperature thermal management system of a battery electric vehicle (BEV). As shown in FIGS. 2A-2C, a majority of the thermal management components may be aggregated into a single compact module 7 which the vehicle manufacturer may install on a chassis 1 in any convenient location, while the other components of the electric propulsion system may be located where logic dictates. For example, a traction motor 16 may be associated with the drive axle 3, the radiators 11,12 may be accessible to ram air flow, and the energy accumulators 6 which are large and heavy may be located between the wheelbase. A person of skill in the art may move the locations of these connections without departing from the spirit of the present disclosure.

Figure 7:
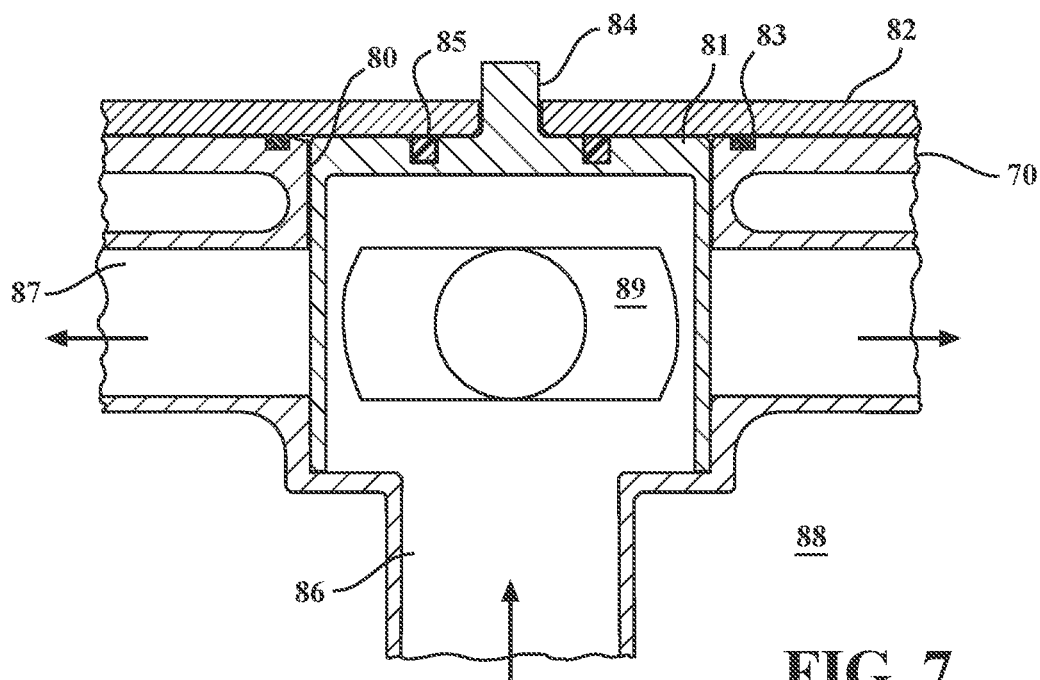
FIG. 7 shows a notional section through one of the multi-port valve cavities in the module, such as a valve, according to an embodiment of the present disclosure.

As further shown in FIGS. 2A-2C, an air conditioning refrigeration sub-system or freon loop 21 in which a freon-like refrigerant such as cyclopentane, or other appropriately desired refrigerant may be circulated by an electric motor-driven compressor prior to passing through the chiller 8 and/or the interior evaporator 20, followed by the condenser 19 where it may change phase into a liquid that may be pumped again by the compressor 18. Elements 54 and 59 may include a 3-way tee connection in the coolant loops, whereas as shown within FIG. 7, 85 illustrates a seal to prevent coolant leakage from the valve assembly. In certain embodiments, the seal 85 may be on the shank of the valve rotor shaft 84.

Each of the propulsion related components as shown in FIG. 1 have heating or cooling needs and thus appear in the FIG. 2A-2C circuit schematics and may have hydraulic connection 17 (exemplary of all of the coolant conduits) to the thermal management module. In certain embodiments, there may be two substantially separate hydraulic circuits, both of which may be served by a singular thermal management module 7. In certain embodiments, two or more separate modules may each serve as an individual circuit where splitting them in this manner is seen as beneficial. A motor 26, 44 may provide power to the pump of each loop or side of the thermal management module 7. In certain embodiments, a diaphragm or wall 41 may separate each loop or side of the thermal management module 7.

As shown within FIG. 2A, a battery flood conduit may originate at port 34 on valve 30 which is a central feature of the battery fire suppression feature described below. FIG. 2A may also include a volume 42, 58, which may provide a coolant reservoir for a coolant for the battery flood feature, such as described herein below.

As further shown within FIG. 2B, of the three outlets from valve 30, one may go directly to the battery, one go through the chiller, and one may go through the heater. The reason for this complication is to avoid the pressure drop inherent in pumping through multiple components in series. A battery flood feature is not shown within FIG. 2B.

In certain embodiments, a heat accumulator 119 may store excess heat generated by the traction motor 16 and may dissipate the excess heat as it is needed on a battery side of the thermal management module 100. The heat accumulator 119 may include a phase change material with a solid to liquid transition temperature higher than an operating temperature of the cooling system. In certain embodiments, the heat accumulator 119 may hold excess heat to normalize greater than normal heat loads between each circulation loop.

In certain embodiments, a system pressure sensor 31, 53 may be provided for each loop on a delivery side of the respective pump, and the pressure responsive signal may be used for diagnostic purposes. Likewise, temperature sensors 35, 65 may be provided to monitor coolant temperature within the module.

Figure 3:
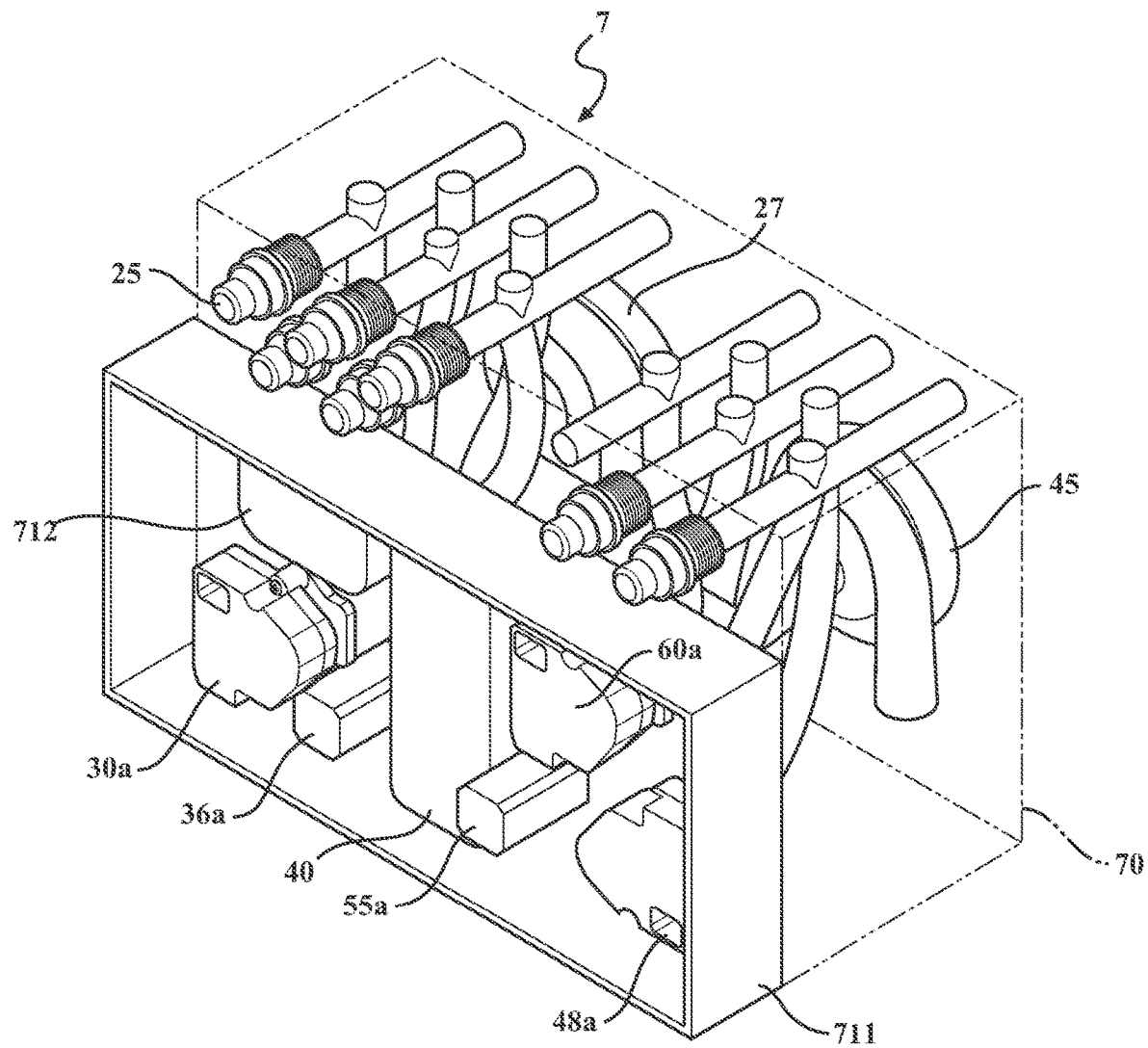
FIG. 3 is a cross-sectional side view showing the thermal management module, according to an embodiment of the present disclosure.

FIG. 3 depicts a cut-away view of an embodiment of the present technology. The thermal control module illustrated at 7 may composed of two parts; a so-called "wet" part or section or compartment that incorporates pumps, valves, and interconnecting conduits for the coolant, and a "dry" cabinet 711 or section or compartment that may house serviceable components including valve actuators 30a, 36a, 48a, 55a, 60a, the electronic control module 712, a wiring harness (not shown), system pressure sensors 31, 53, temperature sensors 35, 65 (FIG. 2A), and the heat exchanger 40. The thermal management unit may include a hermetically sealed cover or closure for the dry cabinet, and a multi-pin plug in the sidewall that may connect to a vehicle controller to provide electrical power to the module and enables communication with the rest of the vehicle.

The wet section 70 of the module may be formed as a monolith with voids where the flow passages e.g., 43, valve bodies and pump volutes are indicated, or it may be skeletal in nature in which case a wall thickness is applied to the flow passages and related components with voids being formed in between. In the latter case, section 70 may be formed as a box with access panels on the rear face wherein the access panels carry the pumps. This may require that the pumps be removable which in turn requires internal connections between the pump inlet and outlet ports and the mating pipework internal to wet section 70 for which O-ring sealed male/female slip joints [not shown] are assumed. A person of skill in the art may optimize these connections and matings without departing from the spirit of the present disclosure.

Because each pump 27, 45 may service an individual coolant circulation loop, for instance pump 27 may service the low temperature energy storage coolant loop while pump 45 may service a higher temperature powertrain loop. Each loop may be separate and independent with the benefit that it may become easier to regulate the discrete temperatures in each loop without the temperature of one loop influencing the other as would be the case if the fluids were able to mix. In certain embodiments, in a monolithic version of the module section 70, a small diameter pipe may interconnect both loops to allow the system pressures to equalize. Alternatively with an open skeletal version of the module, a vertical wall or diaphragm may function as a separator to form two or more discrete compartments, one for each loop to act as a coolant reservoir. In certain embodiments, a hole in that wall may be provided to equalize the system pressure and to also act as an air bleed.

Figure 4:
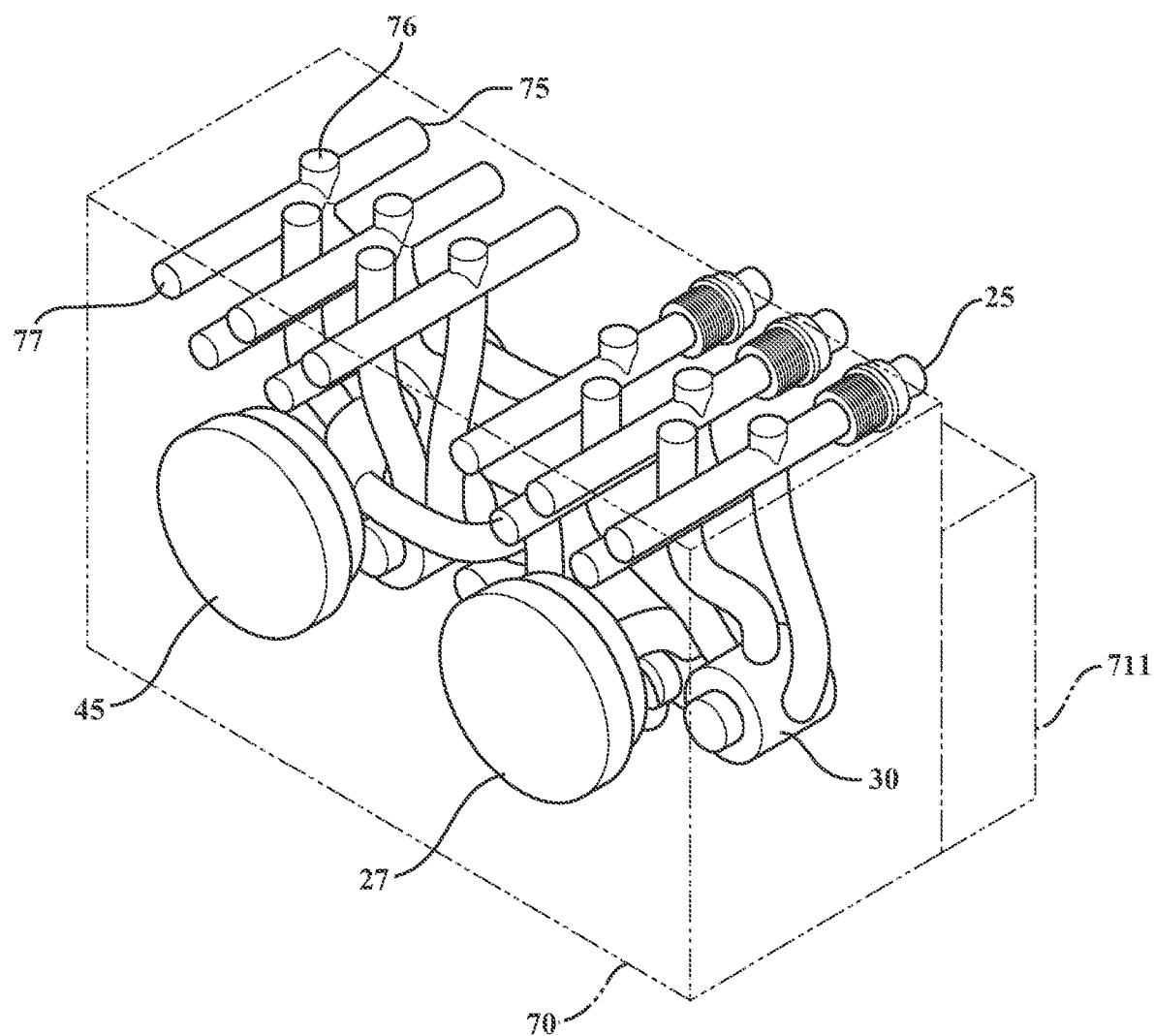
FIG. 4 is a cross-sectional side view showing a further aspect of the thermal management module, according to an embodiment of the present disclosure.

FIG. 4 shows a further cross-sectional view of module 7. Coolant connections to the rest of the vehicle are provided with connector 25 being exemplary, and these connections may take the form of an industry standard or quick connect/disconnect pipe fittings for convenience of installation. The specific location in which module 7 is installed may be dependent upon the chassis layout of a vehicle and may vary depending on the purpose of the vehicle. Likewise, how the external pipe runs going to and from the chassis mounted components approach module 7 may vary, such that the placement of the connector 25 may be optimized by one of skill in the art. To aid in the arrangement, a manifold arrangement in section 70 may be utilized so that one or more port may be provided in the front, back, or top to suit the vehicle layout. In certain embodiments, port locations may be blanked off with a boss (not shown) but into which a connector 25 may be affixed by an appropriate means such as screw threading or thermal welding. By way of example, if the thermal management module 7 were to be mid-mounted transversely in a vehicle chassis, the radiator may be at the front of the vehicle, and thus the associated connections may emerge from the module on that side. If the vehicle has traction motors on both front and rear axles, then the relevant coolant connections may be made on both front and back sides of section 70 of module 7. In particular, the connections may be placed on a location of the module 7 as appropriately desired. In certain embodiments, section 70 of module 7 may include valve cavities formed integral with section 70 into which the valve components may be installed as described herein below.

In certain embodiments, the coolant flow and pressure capabilities of the pumps 27, 45 may be selected to match the vehicle to which the module is fitted. Thus, a high-power vehicle for arduous duty may incorporate a higher flow pump than a low power vehicle, likewise a vehicle with a particularly long chassis such as an omnibus may need a pump that may deliver relatively high pressure to be able to pump coolant from one end of the vehicle to the other. Thus, there may be a requirement that the base section 70 of module 7 may be supplied with pumps of various sizes and capabilities. This may be accounted for by mounting the pumps 27, 45 as mentioned before on individual panels as a sub-assembly that may incorporate an electric motor, an impeller, a volute, and slip-fit connections to an interior pipework of section 70. By standardizing panel dimensions and fastenings and also the size and location of the slip-fit connections, it may become possible to select and install a pump assembly having characteristics appropriate for the target vehicle.

Figure 5:
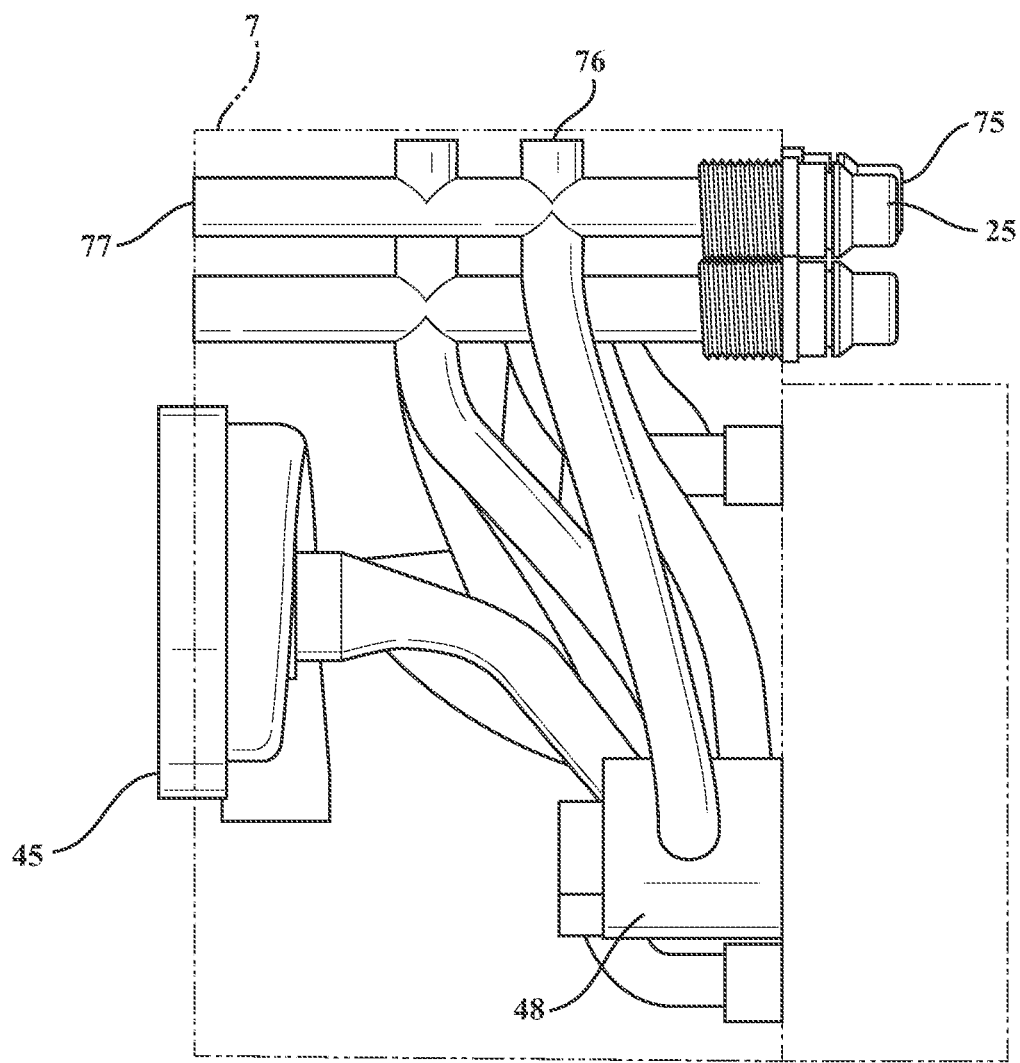
FIG. 5 is a cross-sectional side view showing a further aspect of the thermal management module, according to an embodiment of the present disclosure.

FIG. 5 illustrates a semi-transparent side view of module 7.

Figure 6:
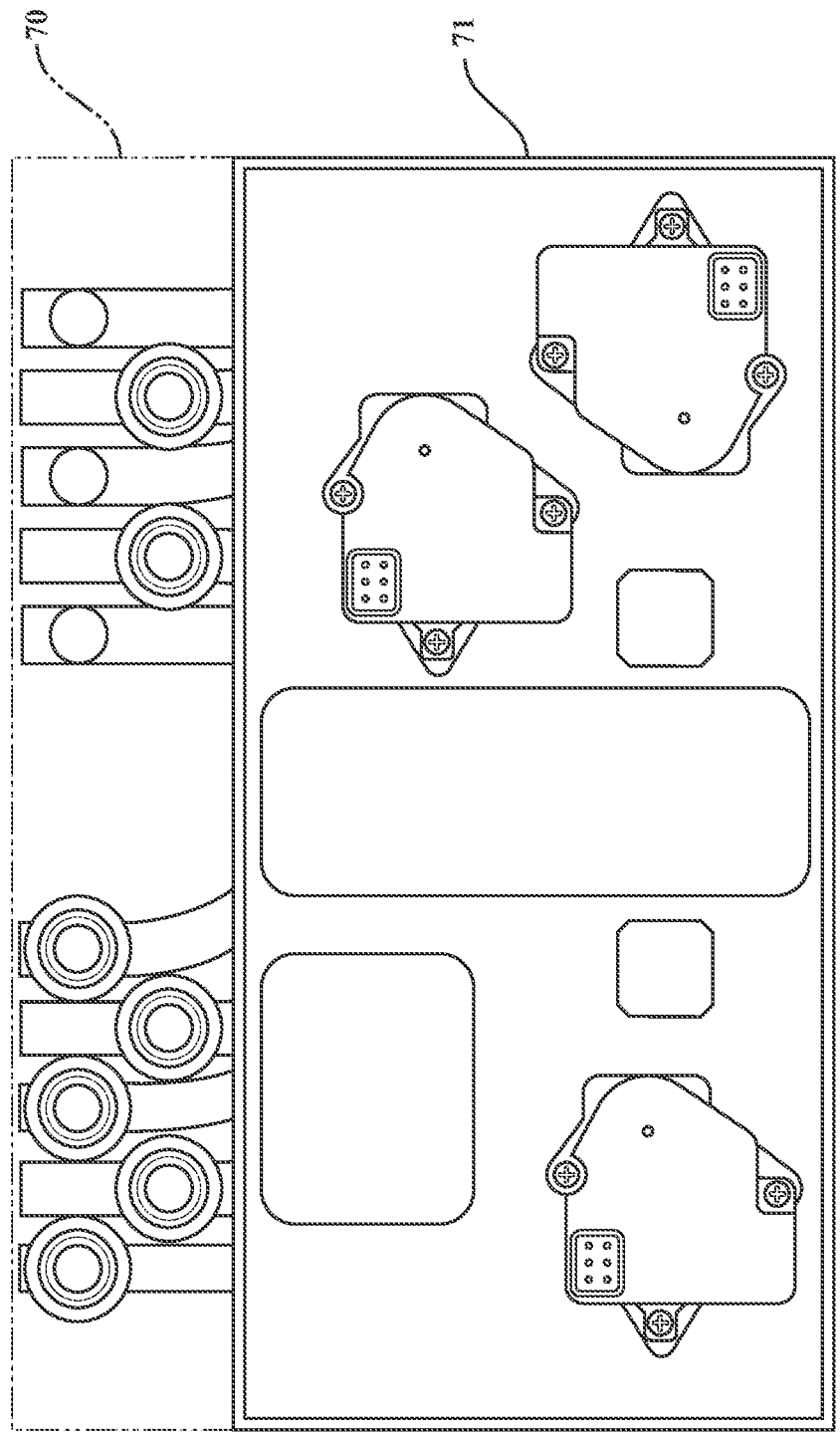
FIG. 6 is a cross-sectional side view showing a further aspect of the thermal management module, according to an embodiment of the present disclosure.

FIG. 6 is a view looking onto the dry cabinet 711 of module 7. In certain embodiments, the module 7 may include a pass-through hole from front to back side through which the electrical harness may pass from the dry cabinet 711 to the pumps 27, 45.

FIG. 7 illustrates a notional section through one of the multi-port valve cavities in module 7 such as valve 30, 48, or 60. A cavity 80 may be formed into the module monolith section 70 into which a close-fitting rotor 81 may be installed. The rotor may be retained by a cover plate 82 and a seal 83. The rotor may include a drive shaft 84 that projects through a cooperating hole in the cover plate 82 so that it may engage with a rotary actuator 30a/48a/60a, and a seal 85 is provided between the rotor and the cover plate 82 to obviate leakage. An axial port 86 may allow coolant to enter or exit the rotor depending on a flow direction, and a plurality of radial ports 87 around the periphery of the cavity 80 allow coolant to be selectively directed depending upon the alignment or registration of one or more windows 89 in the rotor wall with one or more of the ports 87 in the cavity wall. Depending on the dimensions of window 89, one or more of the cavity ports 87 may be exposed at any one time or angular position of rotor 81. A void space 88 may also be included within the module section 70.

Figure 8:
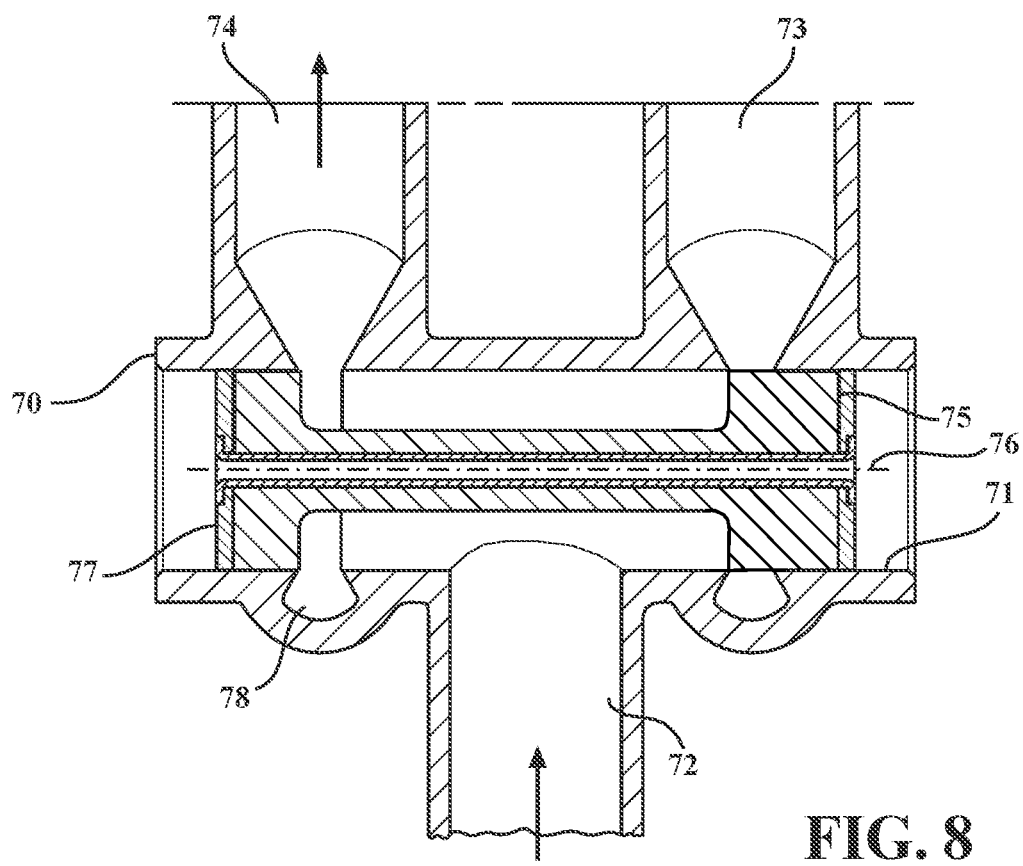
FIG. 8 shows a notional cross section through one of the solenoid actuated valves, according to an embodiment of the present disclosure.

FIG. 8 illustrates a notional cross section through one of the solenoid actuated valves 36, 55. This may include a pressure-balanced spool valve and may be configured as a two-port valve or a three-port valve as appropriately desired. In certain embodiments, it may be actuated by bi-stable latching valve actuators 36a, 55a. The valve body may be formed as part of the module monolith section 70 and may include a bore 71 having two or three ports 79, 73, 74 that break into the bore 71. An inlet port 79 may be spaced intermediate of the outlet ports 73, 74. A close fitting, but slidable, spool 75 may move reciprocally in the bore 71, the spool having an axial through-hole 76 to provide pressure balance between either end of the spool. The spool may have a soft iron armature 77 at one or both end faces to cooperate with the valve actuators 36a, 55a. The outlet ports in the valve body may be formed by peripheral slots in bore 71 such that the slot width creates a flow area that is equivalent to the flow area of the inlet port 79 to thereby create minimal flow restriction. An annular cavity 78 around the slot may direct coolant around the valve body to the outlet ports 73, 74. When urged to the left by the solenoid actuator (not shown in FIG. 8), the spool will open the left hand annular port allowing fluid to flow from inlet 72 through bore 71 into annular cavity 78 to then exit from port 74. In this position, the distal end of the spool will occlude the right hand annular port associated with port 73 thus preventing fluid flow from that port. When the spool is urged to the right by the solenoid actuator, the opposite events take place so that port 74 is occluded and port 73 is open to fluid flow.

Directing attention to the low temperature energy storage cooling loop in FIG. 2A, coolant may enter the pump 27 at the inlet port 28 and after passing through the impeller and volute it may exit at port 29 through a slip-fit connection where a pressure transducer may be installed to compare measured pressure with expected pressure for diagnostic purposes. In certain embodiments, the valve 30 may direct the coolant to the energy storage module 5 either through the heater 9 via valve port 32 or through the chiller 8 via port 33 since there is no requirement foreseen to need the actuation of both modules 8 and 9 concurrently and one wishes to avoid the penalty of the combined flow resistances. The port 34 of valve 30 is only ever actuated when a battery thermal runaway event is indicated for which a fire extinguishing action is required. Upon coolant exiting the energy storage module 5, an output from temperature sensor 23 along with other available information is used to set valve 36 to accept coolant via the radiator 11 and valve port 37, or direct return via the heat exchanger 40 and port 38 on valve 36. In an alternate configuration, valve 36 may be a four-port valve [not shown] which allows the returning coolant to bypass the heat exchanger 40 thereby avoiding the flow resisting pressure drop across it.

Exiting the valve 36 via axial port 39, coolant returns to the inlet port 28 of pump 27 either by a direct piped connection in the full monolith version of module section 70 which would include the slip-fit connection [not shown] described previously, or it may discharge into the volume 42 of the skeletal version of module section 70. A temperature sensor 35 may monitor the returned coolant temperature.

With further reference to the powertrain loop of FIG. 2A, coolant may enter the pump 45 at inlet port 46 and after passing through the impeller and volute it exits at port 47 through a slip-fit connection where a pressure sensor 53 is installed to compare measured pressure with expected pressure for diagnostic purposes. For example, if a vehicle 1 is on the road being driven, then the inverter 15 and the traction motors 16 will need coolant flow. Consequently, the valve 48 may direct a coolant flow to ports 50, 51, and 52. Upon exiting the traction motors 16, an output from temperature sensor 24 along with other available information will be used to control valve 60 via its associated actuator 60a to either port 62 to provide a direct return path to pump 45, or via port 61 in which case the coolant will return through the radiator 12 which may involve the activation of the fan 22 if ram air is inadequate, or if there is heat energy that could be beneficially used to maintain target temperature of the energy storage module then valve 60 will open port 63 enabling coolant to flow through the heat exchanger 40. In certain embodiments (not shown) the traction motors may be cooled indirectly in which case the coolant flows through a heat exchanger to extract heat from an oil circuit that directly cools the motors.

In certain embodiments, if the vehicle 1 is stationary for example and being charged, then valve 48 will open the port 51 thereby directing coolant to the on-board charger module 7, 10. If interior heat is requested, then valve 48 will open port 50 directing coolant through heater 14 to the interior heater core 13. Valve 48 may be configured to allow two ports to be open at one time in the event that interior heat is required at the same time as coolant flow is required by the on-board charger module 7, 10, or by the traction motors 16. The valve 55 may be normally closed, but when activated to the open position may allow coolant flow through port 56 in the reverse direction so that excess heat from the traction motors or the on-board charger may be used to heat the interior. A heater 14 although shown on one side of interior heater core 13, may be configured on either side depending on the direction of flow that is most usual.

The coolant that exits valve 60 via axial port 64 and coolant from valve 55 at port 57 returns to the inlet port 46 of pump 45 either by a direct piped connection in the full monolith version of module section 70 which would include the slip-fit connection [not shown] described previously, or it may discharge into the volume 58 or internal void of the skeletal version of module section 70. A temperature sensor 65 monitors the returned coolant temperature.

Thermal management module 7 has been described with two substantially independent coolant loops appropriate for a battery electric vehicle. The actual plumbing layout and order in which components are interconnected may vary from vehicle-to-vehicle application as appropriately desired. Further, thermal management module 7 may be extended to incorporate multiple additional loops using similar architecture to either of the loops described to support unique applications such as fuel cell vehicles.

Figure 9:
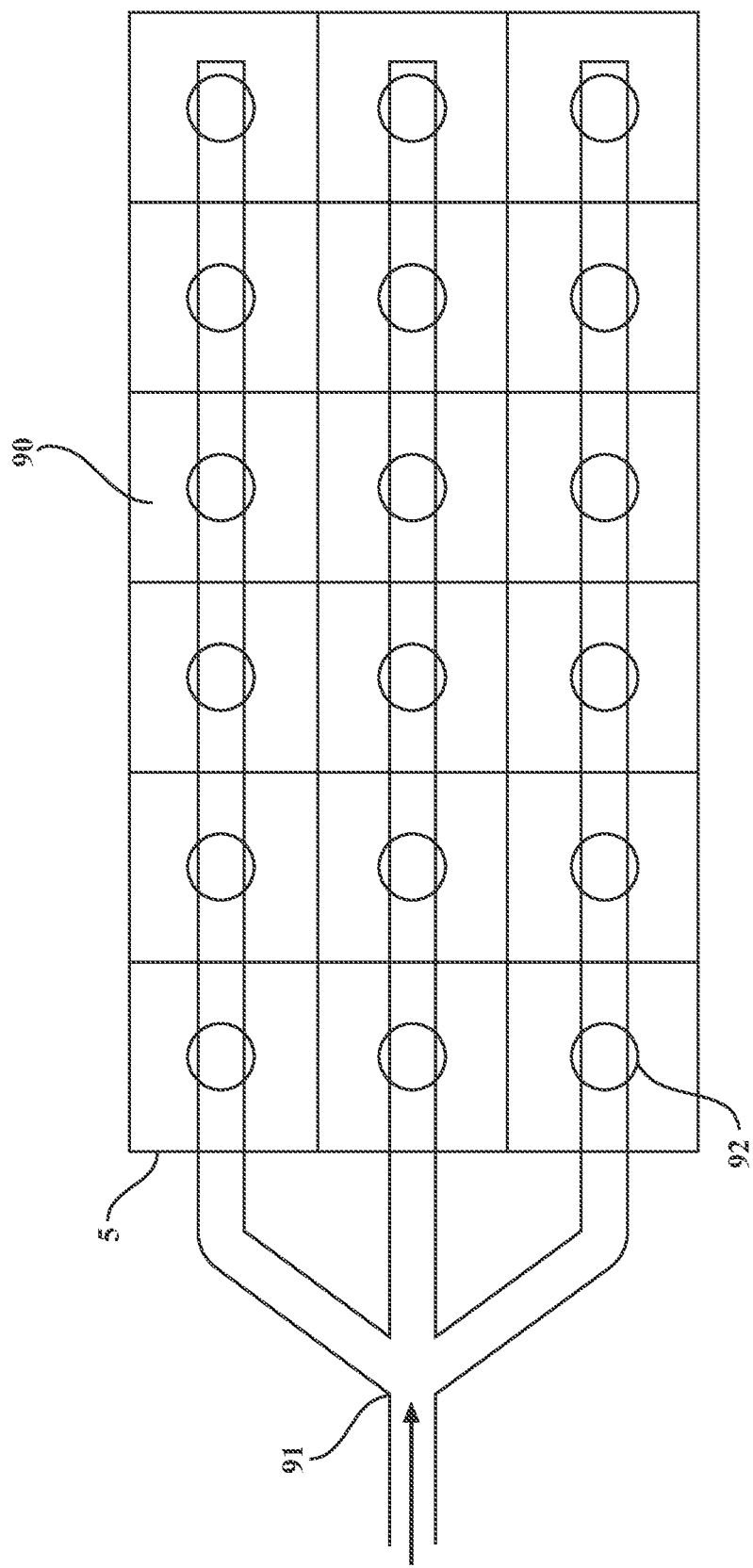
FIG. 9 is a cross-sectional side view showing a countermeasure for preventing a thermal runaway event, according to an embodiment of the present disclosure.

In certain embodiments, a valve 30 within the module 7 may include a port 34 which is normally closed, but which may be connected to a conduit that may direct coolant to the battery pack when port 34 is opened. For example, as shown in FIG. 9, the battery pack 5 may be subdivided into a plurality of sub-sections 90, each battery pack having at least one off-gassing sensor 130 (FIG. 10) associated with it. Above each battery pack is a coolant pipe network 91 comprising a distribution manifold that covers all battery sub-sections 90 with the piping containing coolant supplied from port 34 on valve 30. Above each cell sub-section 90 may be an orifice 92 which is able to deliver coolant to sub-section 90 to effectively flood that individual compartment and thereby short-circuit all of the cells within that compartment and arrest the internal cell failure mode in the event one or more cells that are defective. The coolant delivery orifice 92 may be occluded with a temperature reactive material such as a non-flammable wax which may melt at a predetermined temperature to enable a flood event to take place in the affected compartment.

In certain embodiments, the method of operation of the thermal management unit may indicate that under normal operating conditions, the conduit from port 34 on valve 30 going to battery pack 5 may contain coolant but not under pressure since port 34 is closed, and that coolant is fully contained within piping network 91 since orifices 92 may be occluded. When the off-gassing sensor indicates that it has detected an incipient cell failure, electronic control module 712 of module 7 may command valve 30 to open port 34 and concurrently to run pump 27 to give full flow. In this situation, coolant from volume 42 may be delivered through port 34 to battery pack 5 through network 91. As soon as the temperature reactive wax has melted in response to heat generated by the failing cell or cells within sub-section 90, coolant is now able to flood that compartment and provide a path to short-circuit the terminals of all cells within that compartment as well as absorb the excess thermal energy from the failing cells. In this way, the present technology is able to suppress and extinguish a thermal runaway event before it becomes a conflagration.

Figure 10:
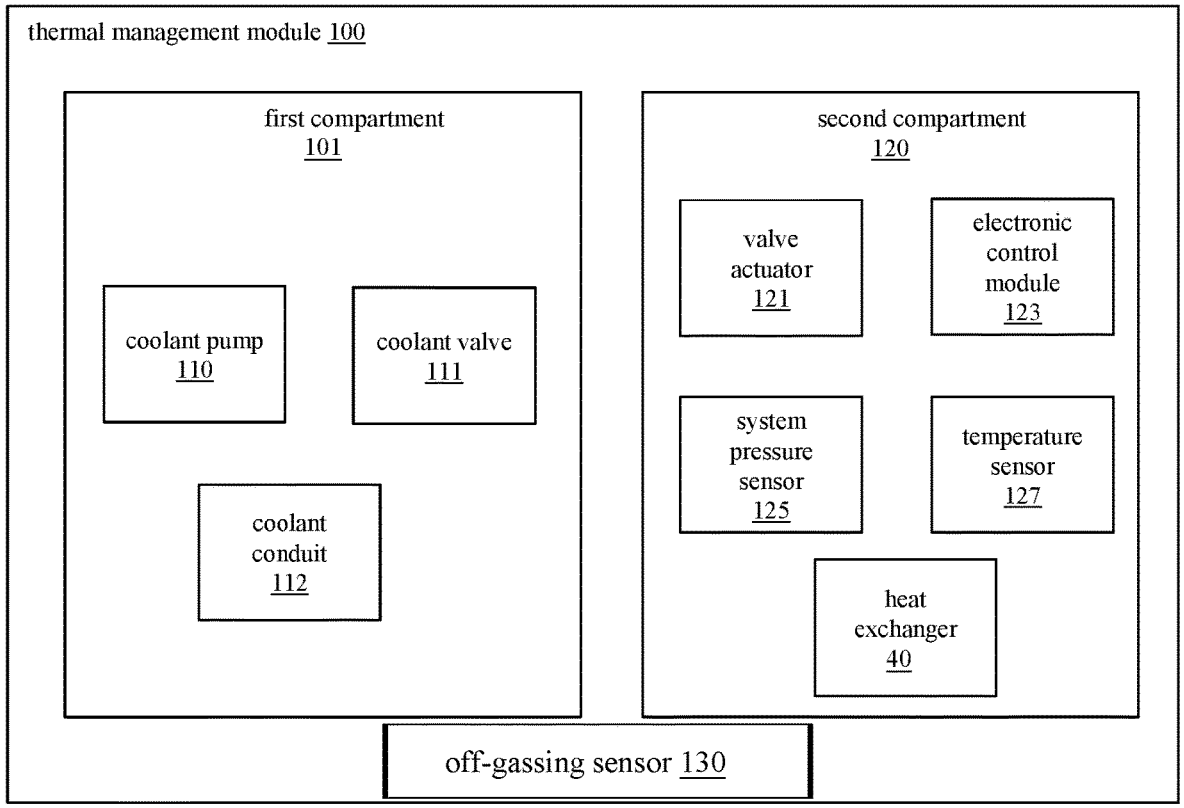
FIG. 10 is a block diagram further illustrating the thermal management module, according to an embodiment of the present disclosure.

FIG. 10 is a block diagram that shows a thermal management module 100, according to an embodiment of the present technology. The thermal management module 100 may include a first section/compartment 101 and a second section/compartment 120. The second section/compartment 120 may be conjoined or linked together with the first section/compartment 101 within the thermal management module 100. The first section/compartment 101 may include a coolant pump 110, a coolant valve 111, and a coolant conduit 112. The second section/compartment 120 may include a valve actuator 121, an electronic control module 123, a system pressure sensor 125, a temperature sensor 127, and a heat exchanger 40. In certain embodiments, the first section/compartment 101 may be enclosed in a first modular enclosure and the second section/compartment 120 may be separately enclosed within a second modular enclosure.

The first modular enclosure and the second modular enclosure may each include a hermetically sealed enclosure. In certain embodiments, the first modular enclosure and the second modular enclosure may each include a multi-pin connection configured to connect to a battery of a vehicle for providing electrical power to the thermal management module. The first section and the second section may be formed at a rear side of the thermal management module 100. In certain embodiments, each of the coolant pump and the coolant valve may be removable. In certain embodiments, each of the first section and the second section may include an individual coolant circulation loop. The individual circulation loop of the first section and the second section may be independent.

Figure 11:
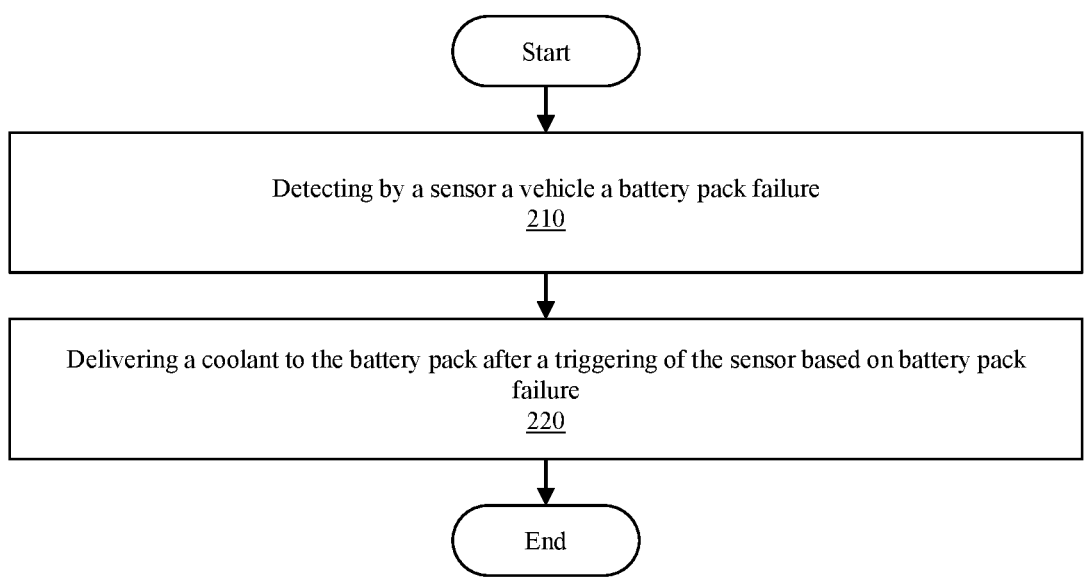
FIG. 11 is a flowchart illustrating a method of preventing a thermal runaway event in an electrical vehicle battery of an electric vehicle, according to an embodiment of the present disclosure.

FIG. 11 is a flowchart that describes a method of preventing a thermal runaway event in an electrical vehicle battery of an electric vehicle, according to some embodiments of the present disclosure. In some embodiments, at 210, the method may include detecting by a sensor a vehicle having a battery pack failure. At 220, the method may include delivering a coolant which may or may not be electrically conductive to the battery pack after a triggering of the sensor based on apparent battery pack failure. In certain embodiments, the triggering of the sensor may include detecting off-gassing of the battery pack. The vehicle battery may include multiple vehicle battery packs and each battery pack may include an off-gassing sensor 130.

In certain embodiments, the vehicle battery pack 5 may include an orifice 92 configured to deliver the coolant to the battery pack. The method may further include occluding the orifice 92 with a temperature reactive material which reacts at a predetermined temperature to enable delivery of the coolant to the battery pack. For example, the temperature reactive material may include a wax which may be configured to melt in response to heat generated by the battery pack 5 failure.

Example embodiments are provided so that this disclosure will be thorough, and will fully convey the scope to those who are skilled in the art. All calculations, described within this patent application, (such as for desired acceleration and velocity) may vary depending on a variety of factors. Any of the ranges of variables (contained within this application) may fall outside the indicated ranges when all factors are considered. Therefore, after the variables are finalized, dimensions and calculations may be performed by someone skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known processes, well-known device structures, and well-known technologies are not described in detail. Equivalent changes, modifications and variations of some embodiments, materials, compositions, and methods may be made within the scope of the present technology, with substantially similar results.

What is claimed is:

1. A thermal management module, comprising:
   a first compartment including a flood conduit that floods a compartment of a battery pack with a liquid coolant to short-circuit a terminal of a battery cell in the compartment when a battery pack fails, the first compartment further including one or more of a coolant pump, a coolant valve, a coolant conduit; and
   a conjoined second compartment including one or more of a valve actuator, an electronic control module, a system pressure sensor, a temperature sensor, and a heat exchanger,
   wherein the first compartment is enclosed in a first modular enclosure and the conjoined second compartment is separately enclosed within a second modular enclosure.

2. The thermal management module of claim 1, wherein the first modular enclosure and the second modular enclosure each include a hermetically sealed enclosure.

3. The thermal management module of claim 2, wherein the second modular enclosure includes a multi-pin connection configured to connect to a battery of a vehicle for providing electrical power and communication to the thermal management module, wherein the multi-pin connection enables communication between the vehicle and the thermal management module.

4. The thermal management module of claim 1, wherein the thermal management module includes a coolant circulation loop that extends between the thermal management module and one or more chassis mounted components.

5. The thermal management module of claim 1, wherein a first coolant circulation loop and a second coolant circulation loop of the thermal management module are independent.

6. The thermal management module of claim 5, wherein the thermal management module comprises more than two coolant circulation loops.

7. The thermal management module of claim 5, wherein a temperature of the first coolant circulation loop and temperature of the second coolant circulation loop are independently regulated.

8. The thermal management module of claim 5, wherein the first coolant circulation loop and the second coolant circulation loop are interconnected thereby allowing equalization of pressure within the thermal management module.

9. The thermal management module of claim 5, further comprising a fluid-to-fluid heat exchanger, wherein the fluid-to-fluid heat exchanger is configured to transfer heat energy between the first coolant circulation loop and the second coolant circulation loop.

10. The thermal management module of claim 6, further comprising a heat accumulator, wherein the heat accumulator is configured to store excess heat generated by one or more powertrain component.

11. A method of using the thermal management module as described in claim 1, comprising:
   transferring thermal energy via the heat exchanger from a thermal fluid to another thermal fluid.

12. A vehicle including the thermal management module as described in claim 1.

13. The vehicle including the thermal management module as described in claim 12, wherein the thermal management module is attached to a chassis of the vehicle.

14. A method of preventing a thermal runaway event in an electrical vehicle battery of an electric vehicle comprising:
   detecting by a sensor a failure of a vehicle battery pack;
   delivering a coolant from a thermal management module to the vehicle battery pack after an indication by the sensor of a battery pack failure; and
   flooding a compartment of the battery pack with the coolant to short-circuit a terminal of a battery cell in the compartment;
   wherein the coolant includes a liquid coolant.

15. The method of claim 14, wherein the indication from the sensor includes detecting off-gassing of the vehicle battery pack.

16. The method of claim 15, wherein the vehicle battery pack includes multiple vehicle battery packs, and wherein each battery pack includes an off-gassing sensor.

17. The method of claim 14, wherein the vehicle battery pack includes an orifice configured to deliver the coolant to the vehicle battery pack to thereby flood the vehicle battery pack.

18. The method of claim 17, further comprising occluding an orifice with a temperature reactive material which reacts at a predetermined temperature to enable delivery of the coolant to the vehicle battery pack.

19. The method of claim 18, wherein the temperature reactive material includes a wax meltable in response to heat generated by the battery pack failure.

20. A thermal management module, comprising:
- a first compartment including a flood conduit that floods a compartment of a battery pack with a liquid coolant to short-circuit a terminal of a battery cell in the compartment when a battery pack fails, a coolant pump, a coolant valve, and a coolant conduit; and
- a conjoined second compartment including a valve actuator, an electronic control module, a system pressure sensor, a temperature sensor, and a heat exchanger, wherein:
- the first compartment is enclosed in a first modular enclosure and the conjoined second compartment is separately enclosed within a second modular enclosure;
- the first modular enclosure and the second modular enclosure each include a hermetically sealed enclosure;
- the second modular enclosure includes a multi-pin connection configured to connect to a battery of a vehicle for providing electrical power and communication to the thermal management module, the multi-pin connection enabling communication between the vehicle and the thermal management module;
- the thermal management module includes a coolant circulation loop that extends between the thermal management module and one or more chassis mounted components; and
- a first coolant circulation loop and a second coolant circulation loop of the thermal management module are independent.

* * * * *